(12) United States Patent
Joshi

(10) Patent No.: US 6,645,557 B2
(45) Date of Patent: Nov. 11, 2003

(54) METALLIZATION OF NON-CONDUCTIVE SURFACES WITH SILVER CATALYST AND ELECTROLESS METAL COMPOSITIONS

(75) Inventor: Nayan H. Joshi, Rock Hill, SC (US)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 09/981,587

(22) Filed: Oct. 17, 2001

(65) Prior Publication Data

US 2003/0113452 A1 Jun. 19, 2003

(51) Int. Cl.$^7$ ............... B05D 3/10; B05D 1/18
(52) U.S. Cl. ............... 427/304; 427/305; 427/306; 427/307; 427/322; 427/443.1
(58) Field of Search ............... 427/304, 305, 427/306, 307, 322, 443.1

(56) References Cited

U.S. PATENT DOCUMENTS

| | | | |
|---|---|---|---|
| 3,011,920 A | 12/1961 | Shipley, Jr. | 117/213 |
| 3,532,518 A | 10/1970 | D'Ottavio | 106/1 |
| 3,553,085 A | 1/1971 | Heymann | 204/30 |
| 3,616,296 A | 10/1971 | Bernhardt et al. | 204/30 |
| 3,902,908 A | 9/1975 | Rantell et al. | 106/1 |
| 3,969,554 A | 7/1976 | Zeblisky | 427/305 |
| 4,048,354 A | 9/1977 | Feldstein | 427/304 |
| 4,066,809 A | 1/1978 | Alpaugh et al. | 427/444 |
| 4,082,557 A * | 4/1978 | Pizzio | 106/1.11 |
| 4,171,225 A | 10/1979 | Molenaar et al. | 106/1.11 |
| 4,180,600 A | 12/1979 | Feldstein | 427/97 |
| 4,182,784 A | 1/1980 | Krulik | 427/304 |
| 4,244,739 A | 1/1981 | Cagnassi | 106/1.11 |
| 4,273,804 A | 6/1981 | Feldstein | 427/97 |
| 4,303,443 A | 12/1981 | Miyazawa et al. | 106/1.23 |
| 4,338,355 A | 7/1982 | Feldstein | 427/98 |
| 4,548,644 A | 10/1985 | Nakaso et al. | 106/1.23 |
| 4,552,626 A * | 11/1985 | Stevenson | 205/168 |
| 4,554,182 A | 11/1985 | Bupp et al. | 427/304 |
| 4,568,570 A | 2/1986 | Giesecke | 427/304 |
| 4,593,016 A | 6/1986 | Amelio et al. | 502/339 |
| 4,608,275 A | 8/1986 | Kukanskis et al. | 427/98 |
| 4,643,793 A | 2/1987 | Nakaso et al. | 156/306.6 |
| 4,734,299 A | 3/1988 | Matuzaki et al. | 427/304 |
| 4,751,106 A | 6/1988 | Wilkinson et al. | 427/98 |
| 4,863,758 A | 9/1989 | Rhodenizer | 427/97 |
| 4,868,253 A | 9/1989 | Hodgson et al. | 525/533 |
| 4,933,010 A | 6/1990 | Okabayashi | 106/1.11 |
| 4,948,707 A | 8/1990 | Johnson et al. | 430/11 |
| 5,076,840 A | 12/1991 | Takita et al. | 106/1.23 |
| 5,110,355 A * | 5/1992 | Pendleton | 106/1.11 |
| 5,160,600 A | 11/1992 | Patel et al. | 205/169 |
| 5,269,838 A | 12/1993 | Inoue et al. | 106/1.22 |
| 5,298,058 A | 3/1994 | Matsui et al. | 106/1.23 |
| 5,421,989 A * | 6/1995 | Stamp et al. | 205/166 |
| 5,543,182 A | 8/1996 | Joshi et al. | 427/443.1 |
| 5,614,004 A | 3/1997 | Wachi et al. | 106/1.23 |
| 5,645,628 A | 7/1997 | Endo et al. | 106/1.23 |
| 5,648,125 A | 7/1997 | Cane | 427/534 |
| 5,725,640 A | 3/1998 | Joshi et al. | 106/1.05 |
| 5,770,032 A | 6/1998 | Cane | 205/210 |
| 5,792,248 A | 8/1998 | Cane | 106/1.11 |
| 6,143,059 A | 11/2000 | Tangi et al. | 106/1.22 |
| 6,406,750 B1 * | 6/2002 | Izaki et al. | 427/304 |

FOREIGN PATENT DOCUMENTS

| | | |
|---|---|---|
| EP | 0 467 199 A2 | 1/1992 |
| EP | 0 616 053 B1 | 9/1994 |
| EP | 0 913 498 A1 | 5/1999 |
| EP | 1 054 081 A2 | 11/2000 |
| WO | 90/00634 | 1/1990 |

\* cited by examiner

*Primary Examiner*—Michael Barr
(74) *Attorney, Agent, or Firm*—Renner, Otto, Boisselle & Sklar, LLP

(57) ABSTRACT

A method of forming a conductive metal layer on a non-conductive surface, including providing a non-conductive surface; contacting the non-conductive surface with an aqueous solution or mixture containing a stannous salt to form a sensitized surface; contacting the sensitized surface with an aqueous solution or mixture containing a silver salt having a pH in the range from about 5 to about 10 to form a catalyzed surface; and electroless plating the catalyzed surface by applying an electroless plating solution to the catalyzed surface.

25 Claims, No Drawings

METALLIZATION OF NON-CONDUCTIVE SURFACES WITH SILVER CATALYST AND ELECTROLESS METAL COMPOSITIONS

FIELD OF THE INVENTION

The present invention relates to processes for applying a metal to a non-conductive surface.

BACKGROUND OF THE INVENTION

During the last three decades, the plating of non-conductive or dielectric substrates has evolved into a big business, covering a wide spectrum of commercial applications. Typical applications range from decorative plating of plastics to automotive parts and printed wiring board fabrication.

A variety of processes have been directed to the problem of applying a metal to non-conductive surfaces, for example, to polymers, glass or other dielectric material. Although a number of such processes are known, none have proven completely satisfactory for various economic and/or environmental reasons. Thus, there exists a need for a further improved process for applying a metal to a non-conductive surface.

In general, the known methods apply a first metal, usually tin, to provide a tie between the surface and a subsequently applied metal, then apply a second, "catalyst" metal, usually palladium, and then apply a third metal layer by an electroless plating process. The third metal is the metal of primary interest, i.e., the metal which is desired to be applied to provide a conductive layer on the non-conductive surface or substrate.

Many conventional methods include the use of palladium as the catalyst metal for subsequent electroless deposition of a metal such as copper. However, palladium is quite expensive, the price at times exceeding the price of gold by a factor of two or more. Other less expensive metals have been suggested as the catalyst, such as silver. However, silver has presented difficulties in that it may not provide sufficient catalytic strength, or may result in a poor deposition of the subsequently applied electroless metal. For these reasons, silver has been disfavored.

Thus, a need remains for a catalytic metal in such applications which is both economical and provides excellent electroless plating results on the non-conductive surface of interest.

SUMMARY OF THE INVENTION

The present invention relates to a method of forming a conductive metal layer on a non-conductive surface, including providing a non-conductive surface; contacting the non-conductive surface with an aqueous solution or mixture containing a stannous salt to form a sensitized surface; contacting the sensitized surface with an aqueous solution or mixture containing a silver salt having a pH in the range from about 5 to about 10 to form a catalyzed surface; and electroless plating the catalyzed surface by applying an electroless plating solution to the catalyzed surface.

In one embodiment the aqueous silver salt solution is at a pH in the range from about 6 to about 9. In one embodiment, the non-conductive surface is contacted with a conditioner prior to contacting with the stannous salt. In one embodiment, the non-conductive surface is modified prior to contacting with the stannous salt, or prior to the conditioning treatment.

The method of the present invention provides an electroless-deposited metal layer which is economical and of excellent quality. Thus, the present invention provides a solution to the problems remaining in the prior art.

DETAILED DESCRIPTION OF THE INVENTION

The present invention relates to a process for metallization of non-conductive materials, and includes steps of surface modification, sensitizing, catalyzing and chemical plating. The method is not limited to, but should include the following steps:

(i) Sensitizing the surface to prepare for application of the catalyst;

(ii) Applying a catalyst to the surface to provide catalytic sites for the initiation of electroless plating;

(iii) Electroless plating the surface to provide a layer of conductive metal, which may be followed by electrolytic plating steps.

The method may further include a step of conditioning to improve sensitizer and catalyst adsorption on difficult to plate plastics.

As noted below, in one embodiment, prior to the conditioning step, the surface is modified initially to activate the surface towards the subsequent treatment steps. Such surface modification may include, for example, treatment with chromic acid, chromic/sulfuric acid, plasma etching and solvent swelling. Such methods are known in the art, and any such method may be bused as appropriate to the non-conductive material.

Non-Conductive Substrates

The process is applicable for the metallization of non-conductor polymer substrates including, for example, ABS, ABS/PC, polyamide (PA), polypropylene (PP), thermoplastic olefins (TPO's), polyphenyleneoxide (PPO), polyphenylene ether, polyimides, polyether imide (PEI), polyether ether ketone (PEEK), polyphenylene sulfide, polyphthalamide, polyurethane (PU) and its blends as well as composites such as epoxy-glass laminates.

Additional non-conductive substrates include a wide variety of non-conductive materials, including synthetic resins such as thermoplastic, thermosetting and elastomeric polymers, and glass. In one embodiment, the substrate is a composite material, e.g., epoxy-glass, phenolic-paper, or polyester-glass; and typical composites used in circuit board manufacturing include polyimides for flexible circuitry or high-temperature applications; paper/phenolic which can be readily punched: NEMA grade FR-2; paper/epoxy which has better mechanical properties than the paper/phenolic: NEMA grade FR-3; glass/epoxy and woven glass fabric which have good mechanical properties: NEMA grade FR-4, FR-5; and random glass/polyester which is suitable for some applications: NEMA grade FR-6.

Typical thermosetting polymeric materials which are suitable include polyepoxides; phenolic resins; aminoplastics; unsaturated polyesters; polyimides; and polyamides. Specific thermosetting polymeric materials include the epoxy resins; phenolic resins, e.g., copolymers of phenol, resorcinol and cresol; and polyimides. The non-conductive substrates can be molded from such polymeric materials additionally containing fillers and/or reinforcing agents, such as glass filled epoxy or phenolic base materials. Other additives which may be present in the polymer include natural fibers such as cotton, paper and cellulose; synthetic fibers; carbon black; powdered alumina; fine silica particles; wax and so forth, used as fillers, pigments, reinforcing agents, mold release agents, and so forth.

In one embodiment, the non-conductive surface is a thermoplastic polymer. The thermoplastic olefins include, among others, polyethylenes and poly(α-olefins) such as poly(1-butene) and poly(1-hexene), wherein the olefin may comprise from 3 to 20 carbon atoms, and may be branched or straight chain compounds. Suitable thermoplastic polymeric materials include polyolefins, such as high and low density polyethylene, polypropylene, polyfluoroethylene, ethylene-propylene copolymers and the like; polyacetals; polyvinyl chloride and copolymers thereof; polyvinyl acetate; polysulfones; polysulfides including polyalkylene sulfides and polyarylene sulfides; polystyrenes and acrylonitrile-butadiene-styrene (ABS) copolymers; polyamides such as poly(hexamethylene adipamide), polycaprolactam, poly(hexamethylene sebacamide), and poly(undecamide); polyimides; polyesterimides; polyetherimides; polycarbonates; polyestercarbonates; polyphenylene oxide; polyacrylics such as poly(methacrylate), polyacrylic acid, and polyacrylonitrile; cellulose esters; polyurethanes; and polyamideimides. In one embodiment, the thermoplastic polymeric material is a polyolefin, e.g., polypropylene; a polysulfone or a polycarbonate. In one embodiment, the polymer is an ABS copolymer. Examples of useful elastomers are natural and synthetic rubbers; silicone rubbers; polyurethane elastomers; and nitrile rubbers.

The foregoing list of non-conductive substrates is intended to be exemplary and is non-limiting. Other suitable non-conducting substrates may be suitably selected by those of skill in the art.

Throughout the present specification and claims, the limits of the ranges and ratios may be combined.

Non-Conductive Surface Modification

In one embodiment, the method includes cleaning the non-conductive substrate. In a typical cleaning, the surface of a non-conductive substrate to be treated is cleaned to remove deposits such as fingerprints, fats and oils and like organic substances, and/or dust deposited due to electrostatic action. Conventional degreasing agents can be used as a treating solution. For example, an alkaline degreasing agent or the like may be used.

In one embodiment, a physical/chemical p retreatment for surface modification of the non-conductive substrate is applied prior to application of the method of the present invention. The surface modification results in a roughened surface having an increased surface area and having an increased susceptibility to attachment of metal ions In subsequent treatment steps. The surface modification pretreatment is intended to enhance attachment of metals in the subsequent steps. The surface modification treatment may include, for example, a solvent swell, a chromic acid etch, a non-chromic acid etch, a plasma treatment, or other known processes for surface preparation, such as lamination and removal of a roughened metal layer from the non-conductive substrate.

The surface modification treatment may selectively dissolve or remove a portion of the surface of the non-conductive substrate to provide an anchor effect. This treatment can improve the adhesion of the subsequently applied metals. The surface modification is carried out by conventional methods. For example, the substrate to be treated may be immersed in a solution of chromic acid and sulfuric acid.

In one embodiment, the step of etching or surface modification includes treatment with a chromic acid ($Cr^{6+}$) solution. In one embodiment, the chromic acid solution includes sulfuric acid. The chromic acid concentration in the chromic acid solution may range from about 20% to about 80% by weight. In an embodiment in which sulfuric acid is present in the chromic acid solution, the sulfuric acid concentration may range from about 20% to about 45% by weight.

When chromic acid is used for modifying the surface of the non-conductive substrate, the chromium ions in many instances becomes an unwanted species, undesirable in subsequent steps, due to possible cross contamination and for environmental reasons. In order to remove the chromium ions, in one embodiment, the chromic acid etch step is followed by a step of applying a reducer or neutralizer. This treatment removes hexavalent chromium and reduces it to trivalent chromium, which is much less hazardous than hexavalent chromium. Suitable reducers include, for example, sodium sulfite and sodium bisulfite, acid salts of hydroxylamine or hydrazine, sucrose, sodium borohydride, etc.

Other chemical etchants which may be suitably used include, for example, alkaline permanganate, alkaline amine solutions, sulfuric/nitric acid mixtures, sulfuric/carboxylic acid mixtures and acids such as chloroacetic acid.

In one embodiment, the surface modification includes treatment with solvent which causes the surface of a polymeric non-conductive material to swell and become easier to etch. This may be especially desirable when employing those polymeric materials that are inherently hydrophobic and/or have a very low surface porosity such as various polyimides, including the polyetherimides.

Different pre-treatments are appropriate for different polymers. For example, different polymers are susceptible to different solvents. Some polymers, such as polyamides, should not be treated with strongly acidic agents. Thus, some amount of trial and error may be required in order to optimize an etchant, a solvent or combination of etchant and solvent for use in such pretreatment of a particular polymeric material.

The choice or solvent depends to some degree on the specific polymeric non-conductive material which is to be metallized. Suitable solvents are known in the art, and may be appropriately selected. Suitable solvents include, for example, glycol ether esters such as acetates, N-alkyl pyrrolidones, aliphatic alcohols, aliphatic amines, alkali metal hydroxides, butyl and ethyl Cellosolve® (butyl is 2-butoxy ethanol), butyl Carbitol® (2-(2-butoxyethoxy) ethanol), and ethylene glycol. Other useful solvents include 2-butoxy ethyl acetate (EBA), propylene glycol monomethyl other (Dowanol PM), and propylene glycol monomethyl ether acetate (Dowanol PMA).

Examples of other suitable solvents include amides (e.g. N,N-dimethylformamide and N-methyl-2-pyrrolidone), nitrites (e.g. acetonitrile), amines (e.g. triethanolamine), dimethyl sulfoxide, propylene carbonate, and γ-butyrolactone, ethyl acetate and butyl acetate. N,N-dimethylformamide is especially suitable for pretreatment of polyetherimides. Other solvents include benzaldehyde, ketones such as cyclohexanone, acetone, methyl ethyl ketone, and the like; acetic acid; carbon disulfide; and the like.

Combinations of such solvents may include, for example, an aqueous alkaline solution containing an alkali metal hydroxide and at least one glycol ether or other suitable solvent. In one embodiment, the swelling agent is a combination of an alkali metal hydroxide and a glycol ether mixture. In another embodiment, a mixture of butyl Cellosolve®, butyl Carbitol®, and ethylene glycol is used. Surfactants may be combined with the foregoing solvents as appropriate.

The surface modification pretreatment may be carried out at an appropriate temperature, for example, a temperature ranging from about 0° C. to about 100° C. In one embodiment, the surface modification pretreatment is carried out at temperature in the range from about 15° C. to about 50° C., or about 25° C. to about 35° C., or at about room temperature.

The surface modification pretreatment may be carried out for an appropriate time, for example, a time ranging from about 1 second to about 100 minutes. In one embodiment, the surface modification pretreatment is carried out for a time from about 30 seconds to about 5 minutes.

Plasma treatment may be used in the surface modification pretreatment of the surface of the non-conductive substrate. Plasma treatment of polymeric surfaces may improve the surface properties, e.g., the surface may be roughened or rendered more susceptible to attachment of metal ions in subsequent steps. Suitable plasmas include, for example, plasmas of an inert gas or oxygen, various lower hydrocarbons (e.g., methane or butane), and combinations of agents, e.g., water and ethanol. Sequential plasma surface treatments are also known such as those comprising a first treatment with a plasma of an inert gas or oxygen, followed by a hydrocarbon plasma. Such plasma treatments may be appropriately selected.

Plasma pretreatment may be appropriate, rather than solvent pretreatment, depending on the nature of the non-conductive surface, and on other considerations such as the environment or economics.

After the surface modification pretreatment, the resin substrate is washed to remove any etching solution, such as chromic acid or the like, remaining on the surface of resin substrate. Chromic acid may be removed from the surface when cleaning is effected using a diluted solution of hydrochloric acid or, as noted above, by using a solution containing a reducing agent such as sodium bisulfite. In one embodiment, a reducing agent is included in the following surface conditioning step, thus avoiding the necessity of adding an additional step of neutralizing any remaining oxidation agents.

Surface Conditioning

In one embodiment, the non-conductive surface is treated with a conditioning agent. The conditioning agent may be applied independently of the surface modification pretreatment, although in general the surface conditioning, when present, follows the surface modification pretreatment of the non-conductive surface, when present.

In one embodiment, the conditioning agent comprises a surfactant. The surfactant may be one or more of nonionic, anionic, cationic or amphoteric surfactants. Suitable surfactants are those disclosed below for use in the electroless deposition.

In one embodiment, the conditioning agent comprises a neutralizing or reducing agent, to remove and/or reduce any remaining chromic acid. In one such embodiment, a neutralizing and/or reducing agent is included in the conditioning agent, and a separate step of neutralizing and/or reducing the chromic acid need not be applied following a chromic acid etching step, prior to the conditioning step.

In one embodiment, in the conditioning step, a neutralizer comprising an acid salt of a reducing agent is applied to the non-conductive substrate. The reducing agent may be one or more of hydrazine, which may be present as a derivative such as hydrazine hydrate, hydrazine sulfate, neutral hydrazine sulfate or hydrazine maleate, hydroxylamine, mono-, di- or triethanolamine, glyoxylic acid, aldehydes such as formaldehyde, benzaldehyde, glyoxal, vanillin or acetaldehyde, hypophosphite, hydrogen borate such as $NaBH_4$ or $KBH_4$, N-dimethylamine borane (DMAB), N-diethylamine borane (DEAB), sodium thiosulfate, sodium ascorbate, monosaccharide, disaccharide or polysaccharide, for example, sucrose. The acid of the acid salt of a reducing agent may be a mineral acid such as hydrochloric, sulfuric or phosphoric, or it may be a sulfonic acid, or it may be a carboxylic acid.

Other examples of monosaccharide include, among others, glucose, dextrose, glucolactone, glucopyranose, fructose and any of mixtures of these substances. Examples of disaccharide include, among others, saccharose, lactose, maltose and any of mixtures of these substances. Examples of polysaccharide include, among others, alginic acid, cellulose, starch, glycogen, pullulan and any of mixtures of these substances.

In one embodiment, the neutralizer is Futuron® Neutralizer, which contains an acid salt of a reducing agent, and is available from Atotech Deutschland GmbH.

In one embodiment, in the conditioning step, a conditioner comprising at least one surfactant and at least one aliphatic amine is applied to the non-conductive substrate. In one embodiment, the at least one surfactant is one or more of nonionic, anionic, cationic or amphoteric surfactants.

In one embodiment, the conditioner further comprises a complexing agent.

In one embodiment, the conditioner is Conditioner CC-301, which contains a mixture of surfactants and aliphatic amines, and is available from Atotech Deutschland GmbH. In another embodiment, the conditioner is Futuron®-C Conditioner, which also contains a mixture of surfactants and aliphatic amines, and is available from Atotech Deutschland GmbH.

In one embodiment, a combination or mixture of a neutralizer and a conditioner, each as described above, is applied to the non-conductive surface. In one such embodiment, a combination of Futuron® Neutralizer and Conditioner CC-301 are employed. In another such embodiment, a combination of Futuron® Neutralizer and Futuron®-C Conditioner is employed.

The conditioning step may be carried out at an appropriate temperature, for example, a temperature ranging from about 0° C. to about 100° C. In one embodiment, the conditioning step is carried out at temperature in the range from about 15° C. to about 50° C., or about 25° C. to about 35° C., or at about room temperature.

The conditioning step may be carried out for an appropriate time, for example, a time ranging from about 1 minute to about 100 minutes. In one embodiment, the conditioning step is carried out for a period from about 2 to about 5 minutes.

Sensitizing Step

Following the initial steps of surface modification, conditioning and other preparation, the non-conductive surface is treated with a sensitizing solution in a sensitizing step. In one embodiment, the sensitizing solution comprises an aqueous solution of tin (II) ($Sn^{2+}$). The tin (II) may be provided as $SnCl_2$, $SnSO_4$, $SnF_2$, $Sn(CH_3SO_3)_2$, tin oxalate, or other suitable, solution soluble salt of tin (II). The tin (II) salt may be dissolved in an acid which corresponds to the salt, or in another suitable acid. For example, $SnCl_2$ may be dissolved in an aqueous solution of hydrochloric acid, and $SnSO_4$ may be dissolved in an aqueous solution of sulfuric acid, and $Sn(CH_3SO_3)_2$ may be dissolved in an aqueous solution of methane sulfonic acid. Alternatively, the tin (II) salt may be dissolved in an acid which does not correspond to the salt counterion.

The tin (II) salt may be present in the sensitizing solution at a concentration in the range from about 0.1 g/l to about 250 g/l. In one embodiment, the tin (II) is present in the sensitizing solution at a concentration in the range from about 1 g/l to about 100 g/l, or about 5 g/l to about 50 g/l, or about 10 g/l to about 25 g/l, or at about 10 g/l. In one embodiment, the tin (II) salt is present as a saturated solution, i.e., at the limit of its solubility in the aqueous medium in which it is dissolved.

The sensitizing step may be carried out at an appropriate temperature, for example, a temperature ranging from about 0° C. to about 100° C. In one embodiment, the sensitizing step is carried out at temperature in the range from about 15° C. to about 50° C., or about 25° C. to about 35° C., or at about room temperature.

The sensitizing step may be carried out for an appropriate time, for example, a time ranging from about 0.1 minute to about 100 minutes. In one embodiment, the sensitizing step is carried out for a period from about 30 seconds to about 10 minutes, or about 1 minute to about 5 minutes, or about 2 minutes.

Catalyzing Step

Following the sensitizing step, the sensitized non-conductive surface is treated with a silver ion-containing catalyzing solution in a catalyzing step. The catalyzing solution comprises an aqueous solution of silver ions, $Ag^+$. In one embodiment, the silver ions are provided to the catalyzing solution in the form of silver nitrate, $AgNO_3$. In another embodiment, the silver ions are provided to the catalyzing solution in the form of silver sulfate, $Ag_2SO_4$. The silver ions may be provided in the form of other silver compounds, but silver nitrate is the most common and easily available silver salt, and it is quite soluble in water.

The present inventor has discovered that, contrary to prior art teachings in which silver ion had been found to be generally unsatisfactory as a catalyst for electroless plating of a non-conductive substrate, under proper conditions silver provides excellent results in such an application. In the prior art, when silver was used in such catalyzing applications, the silver ion was present in an acidic medium. The present inventor has discovered that when silver ion is present in a solution having a pH in the range from about 5 to about 10, excellent catalysis for electroless plating is obtained. In one embodiment, the solution has a pH in the range from about 6 to about 9. The present inventor has discovered that the pH should not be acidic, e.g., below about pH 5, and the pH should not be increased to such a level that the silver becomes photosensitive, e.g., above about pH 10. Thus, an alkaline silver solution at a pH above about pH 10 would be unsatisfactory.

Thus, in accordance with a particular feature of the present invention, the catalyzing solution is substantially neutral pH, i.e., it has a pH in the range from about 5 to about 10, or a pH in the range from about 6 to about 9, or a pH in the range from about 6.5 to about 8.5, or a pH of about 7 to about 8, or a pH of about 6.5. A solution of silver nitrate in water, in the absence of other additives, has a pH of about 6.5. In one embodiment, the silver ion is present in a solution consisting essentially of deionized water and having a pH of about 6.5. These pH values, in the range from pH 5 to about pH 10, are defined herein as substantially neutral.

In one embodiment, the catalyzing solution comprises, in addition to silver ion, an agent such as monoethanolamine, diethanolamine or triethanolamine and complexing agents for silver ion. In one embodiment, the silver ion is present in a solution with calcium chloride in the form of a chloride complex. In such a chloride complex, the calcium chloride is an acid-free source of chloride ions.

The silver salt may be present in the catalyzing solution at a concentration in the range from about 0.1 g/l to about 250 g/l. In one embodiment, the silver is present in the catalyzing solution at a concentration in the range from about 0.5 g/l to about 100 g/l, or about 5 g/l to about 50 g/l, or about 10 g/l to about 25 g/l, or at about 10 g/l. In one embodiment, the silver is present at a concentration of about 500 mg/l, and in one at about 50 g/l. In one embodiment, the silver salt is present as a saturated solution, i.e., at the limit of its solubility in the aqueous medium in which it is dissolved.

The catalyzing step may be carried out at an appropriate temperature, for example, a temperature ranging from about 0° C. to about 100° C. In one embodiment, the catalyzing step is carried out at temperature in the range from about 15° C. to about 50° C., or about 25° C. to about 35° C., or at about room temperature.

The catalyzing step may be carried out for an appropriate time, for example, a time ranging from about 0.1 minute to about 100 minutes. In one embodiment, the catalyzing step is carried out for a period from about 30 seconds to about 10 minutes, or about 1 minute to about 5 minutes, or about 2 minutes.

Electroless Plating Step

Following the step of catalyzation, in which the silver catalyst is applied to the non-conductive surface, a layer of metal is applied by an electroless plating step. The electroless plating step may be any appropriate method of electroless plating which is compatible with the foregoing steps of the method, i.e., which are compatible with the silver catalyst.

In one embodiment of the electroless plating step, one or more plating metals selected from copper, nickel, indium, palladium, platinum, gold, ruthenium, cobalt, and alloys of these metals, may be deposited onto the non-conductive surface by immersing the catalyzed non-conductive surface in an aqueous electroless metal plating composition which comprises at least one solution-soluble metal compound or metal salt selected from one or more plating metals selected from silver, copper, nickel, indium, palladium, platinum, gold, ruthenium, cobalt, and mixtures of two or more thereof.

The electroless plating step may be carried out by any known method of electroless plating which is compatible with the preceding steps of the method of the present invention. In one embodiment, the electroless plating step does not include use of low pH solutions, for example, not less than a pH of about 5. In one embodiment, the pH of the electroless plating step is carried out at a pH in the range from about 5 to about 14. In another, at a pH in the range from about 6 to about 12, in another, at a pH in the range from about 5.5 to about 11, and in others, at a pH from about 6 to about 7, or at a pH of about 10, or at a pH in the range from about 11 to about 13.5 or from 11 to about 14.

In one embodiment, an electroless copper layer is applied in the electroless plating step. In one embodiment, the electroless copper layer is applied by a method described in U.S. Pat. No. 4,303,443 ('443 patent). The method of the '443 patent employs one of three electroless copper plating solutions. In one embodiment, the '443 patent employs an electroless copper plating solution comprising water, a water-soluble copper salt, a complexing agent for cupric ions, a reducing agent, a pH-controlling agent, and at least one of a group of secondary and tertiary alkyl alkyleneoxy amine stabilizers having the general formulae shown and described in the '443 patent at column 4, lines 1–38. In another embodiment, the '443 patent employs an electroless copper plating solution comprising water, a water-soluble copper salt, a reducing agent, a pH-controlling agent, a stabilizer and at least one of complexing agents for cupric ions being an alkylene diamine tetraalkyl acid or salt or an alkylene diamine dialcohol dialkyl acid or salt, having the general formulae shown and described in the '443 patent from column 4, line 39 to column 5, line 17. In another embodiment, the '443 patent employs an electroless copper plating solution comprising water, a water-soluble copper salt, a complexing agent for cupric ion, a reducing agent, a pH-comprising agent, and at least one complexing agent for cuprous ions selected from the cyclic amine compounds represented by the general formulae shown and described in the '443 patent at column 5, lines 18–55. The '443 patent discloses that a pH range from about 11 to about 13.5 may be used. The entire disclosure of the '443 patent relating to electroless plating solutions is incorporated herein by reference.

In another embodiment, the electroless copper layer is applied by a method described in U.S. Pat. No. 4,548,644 ('644 patent). The method of the '644 patent employs an electroless copper deposition solution comprising:

(a) cupric ions, a complexing agent for these cupric ions, a reducing agent and a pH-adjusting agent, (b) a polyoxyethylene ether of the formula:

$$R_1O\text{—}(CH_2CH_2O)_n\text{—}R_2$$

wherein $R_1$ and $R_2$ are independently hydrogen, an alkyl group having 1 to 18 carbon atoms or an alkenyl group having 1 to 18 carbon atoms, but both of $R_1$ and $R_2$ cannot be hydrogen at the same time; and n is a positive value of 2 or more, and (c) at least one member selected from the group consisting of an inorganic cyanide and α,α'-dipyridyl. The complexing agent for the cupric ions of the '644 patent is a compound which can react with cupric ions to form complexes soluble in aqueous alkali solutions. Typical examples of the complexing agent in the '644 patent are ethylenediaminetetraacetic acid (EDTA), the sodium salt thereof, Rochelle salts, N,N,N',N'-tetrakis-(2-hydroxypropyl)-ethylenediamine, triethanolamine, ethylenenitrilotetraethanol, etc. As the reducing agent, the '644 patent discloses formaldehyde, paraformaldehyde, etc. As the pH-adjusting agent, the '644 patent discloses alkali hydroxides such as sodium hydroxide, potassium hydroxide and the like. The '644 patent discloses a pH range of about 11.5 to about 13 may be used. The entire disclosure of the '644 patent relating to electroless plating solutions is incorporated herein by reference.

In other embodiments, other known electroless copper solutions may be used. For example, suitable methods for applying the electroless copper layer are described in U.S. Pat. Nos. 4,171,225, 4,643,793, 5,076,840 and 5,298,058. The disclosures of each of these patents relating to electroless copper layer deposition is incorporated herein by reference.

In one embodiment, an electroless nickel layer is applied in the electroless plating step. In one embodiment, the electroless nickel layer is applied by a method described in U.S. Pat. No. 5,269,838 ('838 patent). The method of the '838 patent employs an electroless plating solution comprising nickel ion, a chelating agent for nickel ion, a reducing agent, one or more soluble salts of a condensate of an arylsulfonic acid with formalin, and thiodiglycolic acid. The condensate of an arylsulfonic acid with formalin has a structure such as:

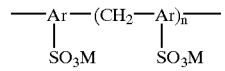

wherein the Ar groups may be the same or different and are phenyl or naphthyl, either of which may be substituted with a $C_1$–$C_{16}$ alkyl group, and M represents Na, K, Ca or $NH_4$ and n is an integer equal to or greater than 6. The chelating agents in the electroless plating solution of the '838 patent include amines such as ethylenediamine, triethanolamine, tetramethylenediamine, diethylenetriamine, EDTA and nitrilotriacetic acid (NTA); pyrophosphates such as potassium pyrophosphate; ammonia; and carboxylic acids such as hydroxycarboxylic acids, aminocarboxylic acids, monocarboxylic acids and polycarboxylic acids. The reducing agents in the electroless plating solution of the '838 patent include hypophosphites such as sodium hypophosphite; alkali metal borohydrides such as sodium borohydride; soluble borane compounds such as dimethylamine borane (DMAB), and trimethylamine borane (TMAB); soluble borane compounds usable also as a solvent such as diethylamine borane and isopropylamine borane; and hydrazine. The '838 patent discloses that the preferred pH range is about 6 to about 7, or higher. The entire disclosure of the '838 patent relating to electroless plating solutions is incorporated herein by reference.

In other embodiments, other known electroless nickel solutions may be used. For example, suitable methods for applying the electroless nickel layer are described in U.S. Pat. Nos. 5,648,125 and 6,143,059. The disclosures of each of these patents relating to electroless nickel layer deposition is incorporated herein by reference.

In one embodiment, an electroless silver layer is applied in the electroless plating step. In one embodiment, the electroless silver layer is applied by a method described in U.S. Pat. No. 5,645,628 ('628 patent). The method of the '628 patent employs an electroless plating bath, comprising a silver material containing silver ions; a reducing agent for the silver ions which contains no metal in the chemical formula thereof; a complexing agent for the silver ions which contains no metal in the chemical formula thereof; and a pH control agent which contains no metal in the chemical formula thereof. The '628 patent discloses that the method is also useful for the electroless application of copper, nickel, cobalt, palladium and gold. The '626 patent discloses that the reducing agent comprises at least one substance selected from the group consisting of tartaric acid, tartrate containing no metal in the chemical formula thereof, monosaccharide, disaccharide, polysaccharide, hydrazine, a hydrazine derivative, aldehyde and polyol. The '628 patent discloses that the complexing agent for silver and copper comprises at least one substance selected from the group consisting of ethylenediamine, an ethylenediamine derivative, ammonia and triethanolamine. The '628 patent discloses that the ammonium salt and ammonia pH control agents are useful for adjusting the pH of silver and copper electroless plating solutions, with tetramethylammonium hydroxide (TMAH) preferred for use with silver. For silver plating, the '628 patent discloses that the reducing agent is preferably tartaric acid, the complexing agent is preferably ethylenediamine, and the pH control agent is preferably TMAH. The '628 patent discloses that the silver may be deposited by electroless plating at a pH of about 10. The entire disclosure of the '628 patent relating to electroless plating solutions is incorporated herein by reference. Other known electroless silver deposition methods compatible with the present invention may be used within the scope of the present invention.

In one embodiment, an electroless gold layer is applied in the electroless plating step. In one embodiment, the electroless gold layer is applied by a method described in U.S. Pat. No. 5,614,004 ('004 patent). The method of the '004 patent employs an electroless gold plating solution containing a gold alkaline metal cyanide, a boron-based reducing agent, an alkali metal hydroxide as a pH controller, and a thallium and/or lead compound, wherein 0.1 to 10 g/l of a chelating agent is added to the electroless gold plating solution. The '004 patent discloses that the chelating agent may be at least one of diethylenetriaminepentaacetic acid, EDTA and NTA. The '004 patent discloses T5 that the concentration of thallium compound and/or lead compound is 0.1 to 50 ppm as metals. The '004 patent discloses that the thallium compound may be at least one of thallium formate, thallium sulfate, thallium oxide, thallium malonate and thallium chloride, and that the lead compound may be at least one of lead citrate, lead acetate and lead oxide. The '004 patent discloses that the boron-based reducing agent is at least one of dimethylaminoborane, boron potassium hydride, and boron sodium hydride. The '004 patent discloses that the solution has a pH value of 11 to 14. The '004 patent discloses that the solution may further comprise 5 to 500 mg/l of sodium nitrobenzenesulfonate and/or p-nitrobenzoic acid. The entire disclosure of the '004 patent relating to electroless plating solutions is incorporated herein by reference. Other known electroless gold deposition methods compatible with the present invention may be used within the scope of the present invention.

As noted above, other metals such as indium, palladium, platinum, ruthenium and cobalt, as well as alloys of any of the disclosed metals, may be deposited by a suitable electroless plating method, compatible with the present invention, within the scope of the present invention.

The electroless plating step may be carried out at an appropriate temperature, for example, a temperature ranging from about 0° C. to about 100° C. In one embodiment, the electroless plating step is carried out at temperature in the range from about 15° C. to about 50° C., or about 25° C. to about 35° C., or at about room temperature.

The electroless plating solution may be applied to the catalyzed non-conductive surface for an appropriate time, for example, a time from about 1 second to about 100 minutes. In one embodiment, the electroless plating solution is applied to the catalyzed non-conductive surface for a period from about 10 seconds to about 10 minutes, or from about 15 seconds to about 200 seconds.

Stabilizing Agent

In one embodiment, the electroless plating solution further comprises a stabilizer. In one embodiment, the stabilizer is any known stabilizer for use in electroless copper plating solutions, for example, sodium cyanide, 2,2'-dipyridyl, o-phenanthroline, 2-mercaptobenzotriazole, benzimidazolethiol and diethylthiourea. In one embodiment, the electroless plating solution comprises a stabilizer such as Stabilizer Covertron Cu, available from Atotech Deutschland GmbH.

In another embodiment, the stabilizing agent is any known stabilizing agent for nickel electroless plating, including e.g., ions of lead, cadmium, bismuth, antimony and mercury.

The stabilizing agent may be present at a suitable concentration, for example, from about 1 ppm to about 50 ppm.

Additional Components

In one embodiment, the electroless plating solution further comprises a copper complex. In one embodiment, the copper complex comprises a commercially available make-up solution such as Covertron Cu, available from Atotech Deutschland GmbH. Covertron Cu Make-Up is a formaldehyde-free copper complex solution. In one embodiment, the electroless plating solution comprises a copper complex solution such as COPPERSHIELD® LT. COPPERSHIELD® LT is a formaldehyde-containing electroless copper bath.

In one embodiment, the electroless plating solution further comprises a pH correction additive, such as Covertron pH Correction Solution, available from Atotech Deutschland GmbH.

In one embodiment, the electroless plating solution further comprises an additional electroless copper deposition rate stabilizer. One such stabilizer is available from Atotech Deutschland GmbH.

In one embodiment, the electroless plating solution further comprises a reducing agent such as hydrazine or dimethylaminoborane (DMAB). In one embodiment, the DMAB is NEOGANTH® WA reducer solution, available from Atotech Deutschland GmbH.

The electroless plating compositions described above may be utilized in the plating of the catalyzed non-conductive substrate using an electroless dip, spray, flood or cascade application process. The electroless plating compositions useful in the method of this invention can be prepared by adding the components to water. The components can be added in any order. The compositions may be stirred mechanically or with low-pressure air from, e.g, a sparger.

The catalyzed non-conductive substrate may be contacted with the electroless plating compositions by immersing or dipping the substrate into the electroless plating compositions maintained at a temperature of from about 0° C. to at least about 90° C. in a continuous process. In one embodiment, the temperature of the composition is in the range of from about 25° C. to about 35° C. In one embodiment, the composition is maintained at a temperature of from about 20° C. to about 50° C. In another embodiment, the temperature of the composition is in the range of from about 35° C. to about 45° C. In another embodiment, the temperature of the composition is in the range of from about 5° C. to about 25° C. In another embodiment, the temperature of the composition is in the range of from about 15° C. to about 35° C.

The plating times may vary in accordance with the desired thickness of the deposited electroless plated metal coating or layer. In one embodiment, the non-conductive surface is immersed in the electroless plating composition for a period in the range from about 1 second up to 15 minutes. In another embodiment, the non-conductive surface is immersed in the electroless plating composition for a period in the range from about 1 minute to about 2 minutes. In another embodiment, the non-conductive surface is maintained in the electroless plating composition for about 1 to about 5 minutes. In another embodiment, the non-conductive surface may be maintained in the electroless plating composition for about 5 to about 60 minutes. The time may be selected so as to provide the desired metal coating quality and thickness.

The electroless plated metal may be applied in a layer ranging from about 0.001 to about 2 μm (0.4–80 microinches (sin); 1 μm–0.0254 μm). In general, the electroless metal may be plated to any desired thickness. However, the electroless plated metal need only be sufficiently thick to provide a conductive surface over the non-conductive surface of the substrate. Once a conductive surface is in place, additional metal may be applied by other, conventional methods such as electroplating. Such methods are generally considerably less expensive than is electroless metal plating, such as described herein. Thus, while thicker layers may be deposited, only a minimum thickness needed to provide a conductive surface for a subsequent electroplating step need be deposited by the electroless metal plating step. Such a minimum thickness may be as thin as a single atomic layer of the electroless plated metal.

The metal layers produced by the methods of the invention are dense and adhere tightly to the underlying non-conductive substrate.

EXAMPLES

Example 1

ABS (EPBM-3570 from GE Plastics) test plaques are first etched in standard chromic acid etch, then treated in a reducer/conditioner step. The reducer/conditioner is a mixture of two Atotech products, Futuron Neutralizer and Conditioner CC-301. This mixture is an acidic composition containing hydrochloric acid, a reducing agent and a mixture of non-ionic and amphoteric surfactants. Such treated plaques are then immersed in an aqueous stannous chloride solution (SnCl$_2$ 15 g/l, HCl 15% by vol.) for 2 minutes at room temperature and then rinsed thoroughly and processed in one of the following silver catalyst compositions for 2 minutes at room temperature.

| Material | |
|---|---|
| Silver Nitrate | 500 mg/liter |
| Methane sulfonic acid (70%) | none |
| Triethanolamine | 2 ml/liter |
| D. I. water | Balance |
| pH | ~8.0 |

Such catalyzed plaques are rinsed and plated in the following non-formaldehyde electroless copper composition for 10 minutes at about 49° C.:

| Material | % by vol. |
|---|---|
| Make-up Solution Covertron Cu (Atotech) (Quadrol-copper complex system) | 10.00 |
| pH Correction Solution Covertron (Atotech) | 3.25 |
| Stabilizer Covertron Cu (Atotech) | 0.30 |
| Electroless copper rate stabilizer (Atotech) | 0.20 |
| Sodium Borohydride solution (12%) | 0.20 |
| D. I. water | Balance |

Good uniform copper coverage is observed on all the non-conductive surfaces of the test plaques.

Comparative Example 1

A second sample of ABS (EPBM-3570 from GE Plastics) plaques are treated as described in Example 1, except that the silver solution is as follows:

| Material | |
|---|---|
| Silver Nitrate | 500 mg/liter |
| Methane sulfonic acid (70%) | 5.00 ml/liter |
| Triethanolamine | none |

| Material | |
|---|---|
| D. I. water | Balance |
| pH | ~2.5 |

The sample is electroless plated in the same manner as described in Example 1. However, in this example, in which the silver solution is at an acidic pH, plating coverage is poor and nonuniform on all the test plaques.

Example 2

ABS (EPBM 3570, GE plastics), ABWPC (Cycoloy MC-1300, GE plastics), polyamide (Capron 8260, Allied Signal) and polypropylene (PP) are racked on plastisol coated racks, etched in chromic/sulfuric etch solution (except polyamide), and then treated in the same reducer/conditioner as in Example 1. Such samples are treated in the tin chloride solution of Example 1, are catalyzed in silver nitrate solution (800 ppm AgNO$_3$ solution, pH 6.5) and then are plated in the non-formaldehyde electroless copper solution of Example 1.

Good uniform metal coverage is observed in all four cases. No copper plating is observed on the plastisol rack coating.

Example 3

The same plastic substrates employed in Example 2 are processed through the chromic acid etch and conditioner/neutralizer as in Example 1, then with tin (II) chloride, 5.0 g/l in 2% by vol. hydrochloric acid, and then in an aqueous solution of silver nitrate (silver ion concentration, 50 g/l). The thus-catalyzed samples are plated in Atotech's COPPERSHIELD® LT, a formaldehyde based electroless copper bath using the following conditions:

| | |
|---|---|
| COPPERSHIELD ® LT part A | 8.0% by vol. |
| COPPERSHIELD ® LT part-B | 8.0% by vol. |
| Electroless copper stabilizer | 0.1% by vol. |

Good uniform metal coverage is observed in all four cases. No copper plating is observed on plastisol rack coating.

Example 4

Duplicate sets of ABS, ABS/PC, polyphenyleneoxide (PPO), polypropylene (PP) and epoxy-glass laminate test plaques are racked and etched as described in Example 2. A first set of such plaques are processed through CC-301 conditioner. A second set is not so conditioned, but is taken directly to the tin step. All the plaques are next processed through tin chloride solution followed by silver solution and then electroless copper composition for 5 minutes, each step carried out as described in Example 2.

Good electroless copper deposition is observed in all the cases. In the case of ABS/PC blend, polypropylene, polyphenyleneoxide and epoxy-glass, the test plaques processed through conditioner CC-301 show more rapid initiation of copper plating and somewhat better plating coverage than those processed without the conditioner CC-301. Plating initiation and coverage on ABS plastic is almost the same in both conditions. No plating is observed on the plastic rack coating in either case.

Example 5

Samples of different grades (densities) of polyurethane foams are processed through conditioning, sensitizing and catalyzing steps followed by electroless copper plating step as described in Example 3. Good uniform copper coverage observed in all the cases.

Example 6

ABS test plaques are processed with the chromic acid etch, and reducer, conditioner/neutralizer as in Example 1, and then treated in different tin (II) sensitizing solutions as follows:

| Material | I | II | III | IV | V |
|---|---|---|---|---|---|
| Tin(II) chloride | 10 g/l | | | | |
| Tin(II) sulfate | | 10 g/l | | | |
| Tin(II) fluoride | | | 10 g/l | | |
| Tin(II) methane sulfonate | | | | 10 g/l | |
| Tin(II) oxalate | | | | | 10 g/l* |
| Hydrochloric acid (37%) | 20 ml/l | | | | |
| Sulfuric acid (98%) | | 10 ml/l | 10 ml/l | | 10 ml/l |
| Methane sulfonic acid (99%) | | | | 10 ml/l | |
| DI water | | | Balance | | |

*saturated solution

The sensitized parts are then treated with silver nitrate and silver sulfate catalysts, followed by a non-formaldehyde electroless copper plating step. Good copper plating coverage is observed in all the cases. However, the tin fluoride example showed somewhat slower plating initiation than did the remaining tin solutions.

Example 7

After appropriate pre-treatment (see note below), test plaques of engineering plastics NORYL® MX5553 (modified polyphenylene ether), ULTEM® 1010-1000 (polyether imide), carbon filled PEEK (polyether ether ketone), SUPEC® G301RA (polyphenylene sulfide), SEQUEL® 1440 (TPO from Solvay) and AMODEL® ET-1002L (modified polyphthalamide) are processed through etching and reducing steps. Such etched parts are then processed through conditioner CC-3OI/HC F45, a mixture of two Atotech conditioner products (a blend of cationic, non-ionic and amphoteric surfactants) followed by sensitizing, catalyzing and electroless copper plating steps as described in Example 4. Good electroless plating coverage is obtained within 3 minutes of plating in all cases except NORYL® MX 5553, for which about 10 minutes is taken to obtain complete coverage due to slow initiation.

In Example 7, the pretreatment varies depending on the exact material. The NORYL® and SEQUEL® are etched with chromic acid. ULTEM® is treated with an alkaline solution of long chain alcohols. PEEK is treated with a halogenated solvent followed by sulfuric acid based etchant. SUPEC® is treated with a sulfuric/nitric acid etchant. Polyamides are not treated with acids, instead polyamides are treated only with solvent.

Example 8

Samples of PG-298 ABS are treated with chromic acid etch, a chromium neutralizer/conditioner, a tin (II) solution (75 g/l stannous chloride in 50 ml/l 37% hydrochloric acid), followed by a silver catalyst solution (silver nitrate, 10 g/l). These catalyzed samples are then plated in the following electroless copper bath, at about 38° C. for about 4 minutes, with dimethyl aminoborane (DMAB) as reducing agent.

| | |
|---|---|
| Covertron Make-up solution | 5.0% by vol. |
| Covertron pH adjuster solution | 2.0% by vol. |
| Covertron stabilizer solution | 0.2% by vol. |
| NEOGANTH ® WA reducer (DMAB soln.) | 0.2% by vol. |

Good uniform copper coverage is obtained in all the cases.

Example 9

Samples of CYCOLAC® EPBM 3570 ABS are processed as described in Example 8 and are then plated in the following hydrazine hydrochloride based electroless copper composition, at about 43° C.:

| | |
|---|---|
| Covertron Make-up solution | 5.0% by vol. |
| Covertron pH adjuster solution | 2.0% by vol. |
| Covertron stabilizer | 0.2% by vol. |
| Hydrazine Hydrochloride | 0.1% by wt. |

The electroless copper plating initiates slowly, but produces good metal coverage after 10 minutes of plating.

Example 10

ABS coupons are processed through etch/reducing/conditioning and tin (II) sensitization steps as in Example 1, followed by silver catalyst solution made by interaction of silver ions and an excess of calcium chloride. Such clear silver-chloride complex solution (pH ~9.0) is used for catalyzation. Catalyzed samples are then rinsed and plated in COPPERSHIELD® LT as described above in Example 3. Good metal coverage is observed after 6 minutes of electroless plating.

Example 11

ABS coupons are etched, reduced, conditioned and then treated in tin (II) solution and silver catalyst as described in Example 2. Such catalyzed samples are then plated in an electroless nickel solution, with dimethylaminoborane as reducing agent; pH ~12, for 6 minutes at 60° C. The electroless nickel solution is prepared as follows. To a solution containing 8 vol. % of NICHEM® 2500 Part A, and 16 vol. % of NICHEM® 2500 Part B, there is added 0.1 vol. % of a 12 wt % solution of DMAB. The pH of the resulting solution is adjusted to pH 12 with sodium carbonate.

Good nickel plating coverage is obtained.

Example 12

ABS, ABS/PC and polypropylene test plaques are first etched in the chromic acid etch, rinsed and treated in the chrome reducer step with Futuron Neutralizer and rinsed. Such treated samples are then processed through Futuron C conditioner (0.5% in 2% hydrochloric acid) and then further treated in the following sensitizer and catalyst steps:

Sensitizer: $SnCl_2$ 200 g/l and HCl (concentrated)100 ml/l

Rinse (deionized water)

Catalyst: Aqueous $AgNO_3$ solution: Ag ions 150 mg/l; pH ~6.5

Rinse (tap water)

Such catalyzed samples are plated in COPPERSHIELD® LT (Atotech USA) electroless copper plating bath for 10 minutes at 35° C. Good copper plating is observed in all cases.

While the invention has been explained in relation to its preferred embodiments, it is to be understood that various modifications thereof will become apparent to those skilled in the art upon reading the specification. For example, at any point prior to application of the electroless plated metal, a photoresist may be applied and developed on the non-conductive surface to provide a selected pattern of the electroless plated metal. Therefore, it is to be understood that the invention disclosed herein is intended to cover such modifications as fall within the scope of the appended claims.

What is claimed is:

1. A method of forming a conductive metal layer on a non-conductive surface, comprising:
   providing a non-conductive surface;
   contacting the non-conductive surface with an aqueous solution or mixture containing a stannous salt to form a sensitized surface;
   contacting the sensitized surface with an aqueous solution or mixture containing a silver salt having a pH in the range from about 5 to about 10 to form a catalyzed surface substantially free of palladium; and
   electroless plating the catalyzed surface by applying an electroless plating solution to the catalyzed surface.

2. The method of claim 1, further comprising a step of modifying the surface prior to contacting the surface with the aqueous solution or mixture of a stannous salt.

3. The method of claim 2, wherein the step of modifying comprises applying an etchant or a solvent to the surface.

4. The method of claim 1, further comprising applying a conditioner to the non-conductive surface.

5. The method of claim 4, wherein the conditioner comprises a surfactant.

6. The method of claim 5, wherein the surfactant comprises an acidic solution of at least one of nonionic, amphoteric and cationic surfactants.

7. The method of claim 5, wherein the conditioner further comprises a reducing agent.

8. The method of claim 7, wherein the reducing agent is in the form of an acid salt.

9. The method of claim 5, wherein the conditioner further comprises a complexing agent.

10. The method of claim 1, wherein the stannous salt is one or more of $SnSO_4$, $SnCl_2$, $SnF_2$, $Sn(HBF_4)_2$ and $Sn(CH_3SO_3)_2$.

11. The method of claim 1, wherein the stannous salt is $SnCl_2$.

12. The method of claim 1, wherein the stannous salt has a concentration in the range from about 0.1 to about 250 g/l.

13. The method of claim 1, wherein the silver salt is one or more of $AgNO_3$, $Ag_2SO_4$, $AgCH_3SO_3$, silver-ammonia complex, silver-amine complex and silver-chloride complex.

14. The method of claim 1, wherein the aqueous solution or mixture containing a silver salt is at a pH in the range from about 6 to about 9.

15. The method of claim 1, wherein the silver salt has a concentration in the range from about 0.01 g/l to about 500 g/l.

16. The method of claim 1, wherein the electroless plating solution is free of formaldehyde.

17. The method of claim 1, wherein the electroless plating solution comprises at least one electroless platable metal selected from silver, copper, nickel, indium, palladium, platinum, gold, ruthenium and cobalt.

18. The method of claim 1, wherein the electroless platable metal is at least one of copper and nickel.

19. The method of claim 1, wherein the non-conductive surface comprises at least one selected from ABS, ABS/PC, polyamide (PA), polypropylene (PP), thermoplastic olefins (TPO's), polyphenyleneoxide (PPO), polyphenylene ether, polyimides, polyether imide (PEI), polyether ether ketone (PEEK), polyphenylene sulfide, polyphthalamides, polyurethanes (PU) and composites.

20. The method of claim 1, wherein the step of electroless plating is conducted at a pH of at least about 6.

21. A method of forming a conductive metal layer on a non-conductive surface, comprising:
   providing a non-conductive surface;
   applying a conditioner to the non-conductive surface to form a conditioned surface;
   contacting the conditioned surface with an aqueous stannous salt to form a sensitized surface;
   contacting the sensitized surface with an aqueous solution or mixture containing a silver salt at a pH in the range from about 6 to about 9 to form a catalyzed surface substantially free of palladium; and
   electroless plating the catalyzed surface by applying an electroless plating solution to the catalyzed surface.

22. The method of claim 21, wherein the aqueous solution or mixture containing a silver salt is substantially free of palladium.

23. The method of claim 21, further comprising a step of modifying the non-conductive surface prior to the step of applying a conditioner.

24. The method of claim 21, wherein the step of electroless plating is conducted at a pH of at least about 6.

25. The method of claim 1, wherein the aqueous solution or mixture containing a silver salt is substantially free of palladium.

* * * * *

(12) EX PARTE REEXAMINATION CERTIFICATE (6468th)
United States Patent
Joshi

(10) Number: US 6,645,557 C1
(45) Certificate Issued: Oct. 7, 2008

(54) METALLIZATION OF NON-CONDUCTIVE SURFACES WITH SILVER CATALYST AND ELECTROLESS METAL COMPOSITIONS

(75) Inventor: Nayan H. Joshi, Rock Hill, SC (US)

(73) Assignee: Atotech Deutschland GmbH, Berlin (DE)

Reexamination Request:
No. 90/008,114, Jul. 7, 2006

Reexamination Certificate for:
Patent No.: 6,645,557
Issued: Nov. 11, 2003
Appl. No.: 09/981,587
Filed: Oct. 17, 2001

(51) Int. Cl.
*C23C 18/20* (2006.01)
*C23C 18/22* (2006.01)
*C23C 18/28* (2006.01)
*H05K 3/18* (2006.01)

(52) U.S. Cl. .......... 427/304; 427/305; 427/306; 427/307; 427/322; 427/443.1

(58) Field of Classification Search .......... None
See application file for complete search history.

(56) References Cited

U.S. PATENT DOCUMENTS

| | | |
|---|---|---|
| 3,105,772 A | 10/1963 | Loiseleur |
| 3,690,921 A | 9/1972 | Elmore |
| 4,078,096 A | 3/1978 | Redmond et al. ............. 427/98 |
| 4,112,139 A | 9/1978 | Shirk et al. .................. 427/54 |
| 4,552,626 A | 11/1985 | Stevenson |
| 4,592,929 A | 6/1986 | Tubergen et al. |
| 5,466,485 A | 11/1995 | Hsu ........................... 427/306 |
| 2002/0187895 A1 | 12/2002 | Izaki et al. .................. 502/330 |

FOREIGN PATENT DOCUMENTS

| | | |
|---|---|---|
| JP | 03-219085 | 9/1991 |
| JP | 2001-152353 | 6/2001 |
| JP | 2001-206735 | 7/2001 |
| WO | 93/17153 | 9/1993 |

OTHER PUBLICATIONS

Japanese Patent Office Official Action and translation, Application No. 2003–536482, mailing date Nov. 6, 2007.

*Primary Examiner*—Stephen Stein

(57) ABSTRACT

A method of forming a conductive metal layer on a non-conductive surface, including providing a non-conductive surface; contacting the non-conductive surface with an aqueous solution or mixture containing a stannous salt to form a sensitized surface; contacting the sensitized surface with an aqueous solution or mixture containing a silver salt having a pH in the range from about 5 to about 10 to form a catalyzed surface; and electroless plating the catalyzed surface by applying an electroless plating solution to the catalyzed surface.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 19 is cancelled.

Claims 1 and 21 are determined to be patentable as amended.

Claims 2–18, 20 and 22–25, dependent on an amended claim, are determined to be patentable.

New claims 26–29 are added and determined to be patentable.

1. A method of forming a conductive metal layer on a non-conductive surface, comprising:
   providing a non-conductive surface;
   contacting the non-conductive surface with an aqueous solution or mixture containing a stannous salt to form a sensitized surface;
   contacting the sensitized surface with an aqueous solution or mixture containing a silver salt having a pH in the range from about 5 to about 10, *and monoethanolamine, diethanolamine, triethanolamine or a complexing agent for silver ion*, to form a catalyzed surface substantially free of palladium; and
   electroless plating the catalyzed surface by applying an electroless plating solution to the catalyzed surface,
   *wherein the non-conductive surface comprises at least one selected from ABS, ABS/PC, polyamide (PA), polypropylene (PP), thermoplastic olefins (TPO's), polyphenyleneoxide (PPO), polyphenylene ether, polyimides, polyether imide (PEI), polyether ether ketone (PEEK), polyphenylene sulfide, polyphthalamides, polyurethanes (PU) and composites.*

21. A method of forming a conductive metal layer on a non-conductive surface, comprising:
    providing a non-conductive surface;
    applying a conditioner to the non-conductive surface to form a conditioned surface;
    contacting the conditioned surface with an aqueous stannous salt to form a sensitized surface;
    contacting the sensitized surface with an aqueous solution or mixture containing a silver salt at a pH in the range from about 6 to about 9, *and monoethanolamine, diethanolamine, triethanolamine or a complexing agent for silver ion*, to form a catalyzed surface substantially free of palladium; and electroless plating the catalyzed surface by applying an electroless plating solution to the catalyzed surface,
    *wherein the non-conductive surface comprises at least one selected from ABS, ABS/PC, polyamide (PA), polypropylene (PP), thermoplastic olefins (TPO's), polyphenyleneoxide (PPO), polyphenylene ether, polyimides, polyether imide (PEI), polyether ether ketone (PEEK), polyphenylene sulfide, polyphthalamides, polyurethanes (PU) and composites.*

*26. A method of forming a conductive metal layer on a non-conductive surface, comprising:
    providing a non-conductive surface;
    contacting the non-conductive surface with an aqueous solution or mixture containing a stannous salt to form a sensitized surface;
    contacting the sensitized surface with an aqueous solution or mixture containing a silver salt having a pH in the range from about 5 to about 10, and monoethanolamine, diethanolamine, triethanolamine or a complexing agent for silver ion, to form a catalyzed surface substantially free of palladium; and
    electroless plating the catalyzed surface by applying an electroless plating solution to the catalyzed surface,
    wherein the non-conductive surface comprises a thermoplastic, thermosetting or elastomeric polymer.*

*27. The method of claim 1 wherein the complexing agent for silver ion forms a chloride complex with the silver ion.*

*28. The method of claim 21 wherein the complexing agent for silver ion forms a chloride complex with the silver ion.*

*29. The method of claim 26 wherein the complexing agent for silver ion forms a chloride complex with the silver ion.*

\* \* \* \* \*